US009607536B2

(12) United States Patent
Chen et al.

(10) Patent No.: US 9,607,536 B2
(45) Date of Patent: Mar. 28, 2017

(54) TESTING APPARATUS FOR ELECTRONIC DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Chun-Sheng Chen, New Taipei (TW); Zhen-Sheng Wang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 169 days.

(21) Appl. No.: 14/677,705

(22) Filed: Apr. 2, 2015

(65) Prior Publication Data

US 2016/0117964 A1 Apr. 28, 2016

(30) Foreign Application Priority Data

Oct. 22, 2014 (CN) .......................... 2014 1 0565699

(51) Int. Cl.

| | |
|---|---|
| ***G01R 31/3187*** | (2006.01) |
| ***G09G 3/00*** | (2006.01) |
| ***G01R 31/317*** | (2006.01) |
| ***G01R 31/30*** | (2006.01) |
| ***G01R 31/28*** | (2006.01) |
| ***G01R 19/257*** | (2006.01) |
| ***G01R 31/319*** | (2006.01) |
| *G01R 31/3181* | (2006.01) |

(52) U.S. Cl.

CPC .......... *G09G 3/006* (2013.01); *G01R 19/257* (2013.01); *G01R 31/2884* (2013.01); *G01R 31/3004* (2013.01); *G01R 31/31724* (2013.01); *G01R 31/31908* (2013.01); *G01R 31/3181* (2013.01)

(58) Field of Classification Search

CPC .............. G01R 19/257; G01R 31/2884; G01R 31/3004; G01R 31/3181; G01R 31/31813

USPC ......... 324/71, 378, 403, 415, 425, 500, 537, 324/750.3

See application file for complete search history.

(56) References Cited

U.S. PATENT DOCUMENTS

2008/0252631 A1* 10/2008 Hori ....................... G09G 3/006 345/208

2011/0109536 A1* 5/2011 Huang ................... G09G 3/006 345/99

2013/0268819 A1* 10/2013 Chae ................. G01R 31/3177 714/733

* cited by examiner

*Primary Examiner* — Jermele M Hollington
*Assistant Examiner* — Raul Rios Russo
(74) *Attorney, Agent, or Firm* — Zhigang Ma

(57) ABSTRACT

A testing apparatus to establish a fault by a process of elimination includes an input unit, a signal converting unit, a switch unit, and a display unit. The input unit receives an input signal and outputs a switch signal. The signal converting unit receives the switch signal and outputs a control signal. The switch unit receives the control signal and outputs a test signal. The display unit receives the test signal and runs a built in self test (BIST) program to test the proper functioning of the display unit. The signal converting unit outputs a data signal and a clock signal to the display unit when the display unit works normally. The signal converting unit not output the data signal and the clock signal to the display unit when the input signal and resulting control signal are repeated.

16 Claims, 2 Drawing Sheets

TESTING APPARATUS FOR ELECTRONIC DEVICE

CROSS-REFERENCE TO RELATED APPLICATIONS

This application claims priority to Chinese Patent Application No. 201410565699.6 filed on Oct. 22, 2014, the contents of which are incorporated by reference herein.

FIELD

The subject matter herein generally relates to technology of analysis.

BACKGROUND

Personal computers usually go into blank screen as a result of system malfunction. Users can not determine whether the malfunction is caused by a host computer or by a monitor. The host computer and the monitor are tested individually to find the problem.

BRIEF DESCRIPTION OF THE DRAWINGS

Implementations of the present technology will now be described, by way of example only, with reference to the attached figures.

DETAILED DESCRIPTION

Figure 1:
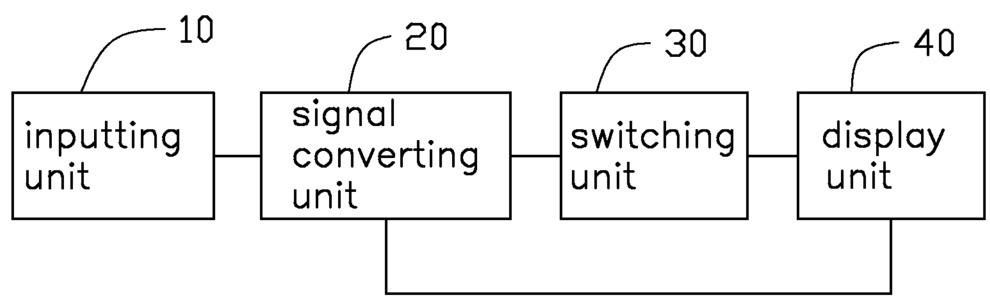
FIG. 1 is a block diagram of an embodiment of a testing apparatus for an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like. "Unit" means a collection of electronic hardware alone or in combination with software configured for a particular task or function, although units may overlap or share components.

FIG. 1 illustrates a testing apparatus for electronic device in accordance with one embodiment. The testing apparatus for electronic device includes an input unit 10, a signal converting unit 20, a switch unit 30, and a display unit 40.

Figure 2:
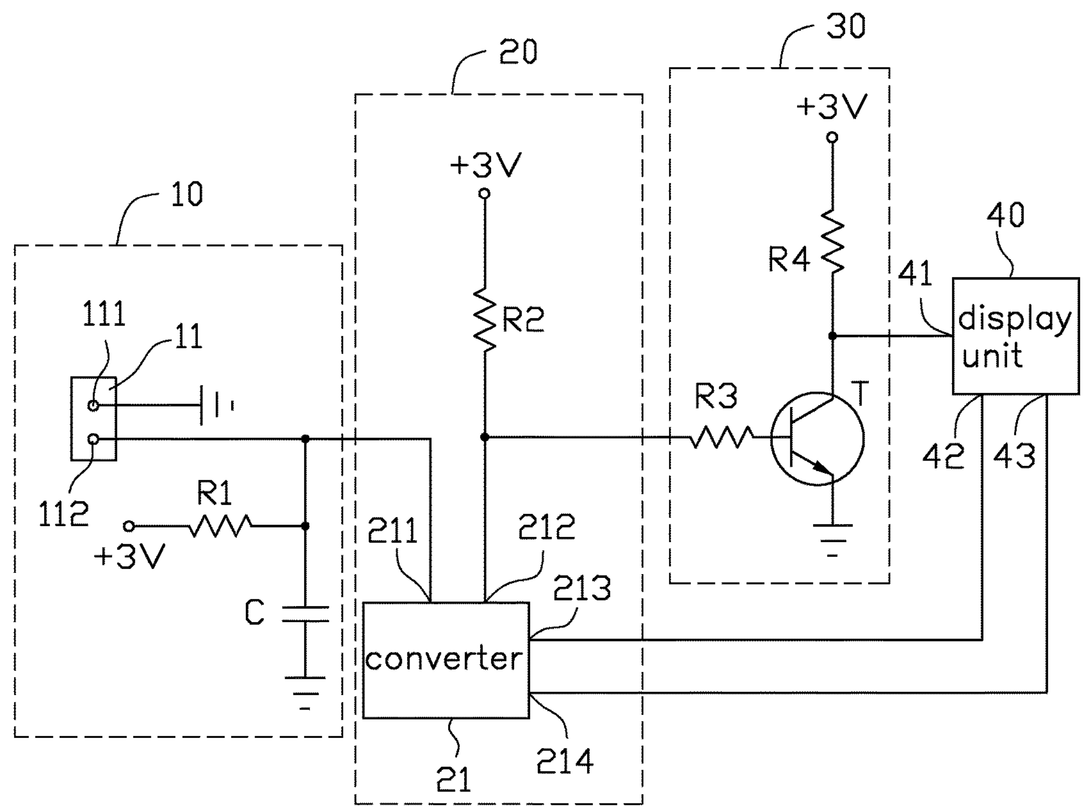
FIG. 2 is a circuit diagram of the testing apparatus for electronic device of FIG. 1.

FIG. 2 illustrates that the input unit 10 includes a switch 11, a first resistor R1, and a capacitor C. The switch 11 includes a ground terminal 111 and an output terminal 112. The ground terminal 111 is grounded. The output terminal 112 of the switch 11 is electrically coupled to the signal converting unit 20. A first terminal of the first resistor R1 receives a direct current (DC) voltage. A second terminal of the first resistor R1 is electrically coupled to the output terminal 112 of the switch 11. The second terminal of the first resistor R1 is grounded via the capacitor C. In at least one embodiment, the switch 11 is a push button switch. The DC voltage is +3 volts.

The signal converting unit 20 includes a converter 21 and a second resistor R2. The converter 21 includes a first general purpose input output (GPIO) interface 211, a second GPIO interface 212, a data signal output terminal 213, and a clock signal output terminal 214. The first GPIO interface 211 is electrically coupled to the output terminal 112 of the switch 11. The second GPIO interface 212 receives the DC voltage via the second resistor R2. The second GPIO interface 212 is electrically coupled to the switch unit 30. The data signal output terminal 213 and the clock signal output terminal 214 are electrically coupled to the display unit 40. The data signal output terminal 213 and the clock signal output terminal 214 are configured to respectively output a low voltage differential data signal and a low voltage differential clock signal.

The switch unit 30 includes a transistor T, a third resistor R3, and a fourth resistor R4. The transistor T includes a first terminal, a second terminal, and a third terminal. The first terminal of the transistor T is electrically coupled to the second GPIO interface 212 via the third resistor R3. The second terminal of the transistor T is grounded. The third terminal of the transistor T receives the DC voltage via the fourth resistor R4. The third terminal of the transistor T is electrically coupled to the display unit 40. In at least one embodiment, the transistor T is an npn type transistor. The first terminal, the second terminal, and the third terminal of the transistor T are the base, emitter, and collector respectively.

The display unit 40 includes a test signal input terminal 41, a data signal input terminal 42, and a clock signal input terminal 43. The test signal input terminal 41 is electrically coupled to the third terminal of the transistor T. The data signal input terminal 42 is electrically coupled to the data signal output terminal 213. The clock signal input terminal 43 is electrically coupled to the clock signal output terminal 214. In at least one embodiment, the display unit 40 stores a built in self test (BIST) program.

In use, the data signal input terminal 42 and the clock signal input terminal 43 receive the low voltage differential data signal and the low voltage differential clock signal from the data signal output terminal 213 and the clock signal output terminal 214 respectively, when the display unit 40 works normally.

When the display unit 40 is to be tested, the switch 11 is pressed. The ground terminal 111 is electrically coupled to the output terminal 112 of the switch 11. The output terminal 112 of the switch 11 outputs a low voltage level switch signal to the first GPIO interface 211 of the converter 21. The data signal output terminal 213 and the clock signal output terminal 214 of the converter 21 stop outputting their respective low voltage differential data signal and the low voltage differential clock signal. The second GPIO interface 212 of the converter 21 outputs a high voltage level control signal. The first terminal of the transistor T receives the high voltage level control signal. The transistor T turns on. The third terminal of the transistor T outputs a low voltage level test signal to the test signal input terminal 41 of the display unit 40. The display unit 40 runs the BIST program accordingly, to test the display unit 40.

When the test is complete, the switch 11 is pressed again. The ground terminal 111 and the output terminal 112 of the switch 11 are cut off. The first GPIO interface 211 of the converter 21 receives the DC voltage via the first resistor R1. The first GPIO interface 211 receives a high voltage level switch signal. The second GPIO interface 212 of the converter 21 outputs a low voltage level control signal. The first terminal of the transistor T receives the low voltage level control signal. The transistor T turns off. The third terminal of the transistor T outputs a high voltage level test signal to the test signal input terminal 41 of the display unit 40. The display unit 40 stop running the BIST program accordingly, to complete the test.

The data signal output terminal 213 and the clock signal output terminal 214 of the converter 21 output the respective low voltage differential data signal and the low voltage differential clock signal again according to the high voltage level switch signal. The data signal input terminal 42 and the clock signal input terminal 43 receive the respective low voltage differential data signal and the low voltage differential clock signal. The display unit 40 again goes into working state.

The embodiments shown and described above are only examples. Many details are often found in the art such as the other features of a testing apparatus for electronic device.

Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A testing apparatus comprising:

an input unit configured to receive an input signal and to output a switch signal;

a signal converting unit configured to receive the switch signal and to output a control signal;

a switch unit configured to receive the control signal and to output a test signal; and a display unit configured to receive the test signal and run a built in self test (BIST) program to test the display unit, wherein the signal converting unit is configured to output a data signal and a clock signal to the display unit when the display unit works normally, and wherein the signal converting unit is configured to not output the data signal and the clock signal to the display unit when the display unit is tested according to the switch signal.

2. The testing apparatus of claim 1, wherein the data signal is a low voltage differential data signal; and the clock signal is a low voltage differential clock signal.

3. The testing apparatus of claim 2, wherein the input unit comprises a switch, a first resistor, and a capacitor; the switch comprises a ground terminal and an output terminal; the ground terminal is grounded; the output terminal of the switch is configured to output the switch signal; a first terminal of the first resistor receives a direct current (DC) voltage; a second terminal of the first resistor is electrically coupled to the output terminal of the switch; and the second terminal of the first resistor is grounded via the capacitor.

4. The testing apparatus of claim 3, wherein the switch is a push button switch; and the DC voltage is +3 volts.

5. The testing apparatus of claim 3, wherein the signal converting unit comprises a converter and a second resistor; the converter comprises a first general purpose input output (GPIO) interface, a second GPIO interface, a data signal output terminal, and a clock signal output terminal; the first GPIO interface is electrically coupled to the output terminal of the switch for receiving the switch signal; the second GPIO interface receives the DC voltage via the second resistor; the second GPIO interface is configured to output the control signal; the data signal output terminal and the clock signal output terminal are electrically coupled to the display unit respectively; and the data signal output terminal and the clock signal output terminal are configured to output the low voltage differential data signal and the low voltage differential clock signal respectively.

6. The testing apparatus of claim 5, wherein the switch unit comprises a transistor, a third resistor, and a fourth resistor; the transistor comprises a first terminal, a second terminal, and a third terminal; the first terminal of the transistor is electrically coupled to the second GPIO interface via the third resistor for receiving the control signal; the second terminal of the transistor is grounded; the third terminal of the transistor receives the DC voltage via the fourth resistor; and the third terminal of the transistor is configured to output the test signal.

7. The testing apparatus of claim 6, wherein the transistor is an npn type transistor; and the first terminal, the second terminal, and the third terminal of the transistor are base, emitter, and collector respectively.

8. The testing apparatus of claim 7, wherein the display unit comprises a test signal input terminal, a data signal input terminal, and a clock signal input terminal; the test signal input terminal is electrically coupled to the third terminal of the transistor for receiving the test signal; the data signal input terminal is electrically coupled to the data signal output terminal for receiving the low voltage differential data signal; and the clock signal input terminal is electrically coupled to the clock signal output terminal for receiving the low voltage differential clock signal.

9. A testing apparatus comprising:

an input unit configured to receive an input signal and to output a switch signal;

a signal converting unit configured to receive the switch signal and to output a control signal;

a switch unit configured to receive the control signal and to output a test signal; the switch unit comprising a transistor; and a display unit configured to receive the test signal and run a built in self test (BIST) program to test the display unit, wherein the signal converting unit is configured to output a data signal and a clock signal to the display unit when the display unit works normally, the signal converting unit outputs a low voltage level control signal to the transistor, and the transistor turns off and outputs a high voltage level test signal to the display unit, and wherein the signal converting unit is configured to not output the data signal and the clock signal to the display unit when the display unit is tested according to the switch signal, the signal converting unit outputs a high voltage level control signal to the transistor, and the transistor turns on and outputs a low voltage level test signal to the display unit.

10. The testing apparatus of claim 9, wherein the data signal is a low voltage differential data signal; and the clock signal is a low voltage differential clock signal.

11. The testing apparatus of claim 10, wherein the input unit comprises a switch, a first resistor, and a capacitor; the switch comprises a ground terminal and an output terminal; the ground terminal is grounded; the output terminal of the switch is configured to output the switch signal;

a first terminal of the first resistor receives a direct current (DC) voltage; a second terminal of the first resistor is electrically coupled to the output terminal of the switch; and the second terminal of the first resistor is grounded via the capacitor.

12. The testing apparatus of claim 11, wherein the switch is a push button switch; and the DC voltage is +3 volts.

13. The testing apparatus of claim 11, wherein the signal converting unit comprises a converter and a second resistor; the converter comprises a first general purpose input output (GPIO) interface, a second GPIO interface, a data signal output terminal, and a clock signal output terminal; the first GPIO interface is electrically coupled to the output terminal of the switch for receiving the switch signal; the second GPIO interface receives the DC voltage via the second resistor; the second GPIO interface is configured to output the control signal; the data signal output terminal and the clock signal output terminal are electrically coupled to the display unit respectively; and the data signal output terminal and the clock signal output terminal are configured to output the low voltage differential data signal and the low voltage differential clock signal respectively.

14. The testing apparatus of claim 13, wherein the switch unit further comprises a third resistor and a fourth resistor; the transistor comprises a first terminal, a second terminal, and a third terminal; the first terminal of the transistor is electrically coupled to the second GPIO interface via the third resistor for receiving the control signal; the second terminal of the transistor is grounded; the third terminal of the transistor receives the DC voltage via the fourth resistor; and the third terminal of the transistor is configured to output the test signal.

15. The testing apparatus of claim 14, wherein the transistor is an npn type transistor; and the first terminal, the second terminal, and the third terminal of the transistor are base, emitter, and collector respectively.

16. The testing apparatus of claim 15, wherein the display unit comprises a test signal input terminal, a data signal input terminal, and a clock signal input terminal; the test signal input terminal is electrically coupled to the third terminal of the transistor for receiving the test signal; the data signal input terminal is electrically coupled to the data signal output terminal for receiving the low voltage differential data signal; and the clock signal input terminal is electrically coupled to the clock signal output terminal for receiving the low voltage differential clock signal.

* * * * *